(12) United States Patent
Watt et al.

(10) Patent No.: US 6,455,233 B1
(45) Date of Patent: Sep. 24, 2002

(54) MICROMACHINING USING HIGH ENERGY LIGHT IONS

(75) Inventors: Frank Watt; Stuart Victor Springham; Thomas Osipowicz, all of Singapore (SG); Mark Breese, Surrey (GB)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 09/297,577

(22) PCT Filed: Nov. 6, 1997

(86) PCT No.: PCT/SG97/00057

§ 371 (c)(1),
(2), (4) Date: Jul. 6, 1999

(87) PCT Pub. No.: WO98/20517

PCT Pub. Date: May 14, 1998

(30) Foreign Application Priority Data

Nov. 7, 1996 (SG) .......................................... 9611095-2

(51) Int. Cl.[7] ................................................. G03F 7/20
(52) U.S. Cl. ...................... 430/322; 430/296; 430/311; 250/492.21
(58) Field of Search ................................. 430/311, 322, 430/296, 942; 250/492.2, 492.21, 492.22, 492.23, 492.3

(56) References Cited

U.S. PATENT DOCUMENTS

| | | | | |
|---|---|---|---|---|
| 4,405,710 A | * | 9/1983 | Balasubramanyam et al. | 430/311 |
| 4,757,208 A | * | 7/1988 | McKenna et al. | 250/492.2 |
| 5,236,547 A | * | 8/1993 | Takahashi et al. | 156/628 |
| 5,264,328 A | * | 11/1993 | DellaGuardia et al. | 430/322 |
| 5,362,606 A | * | 11/1994 | Hartney et al. | 430/315 |
| 5,378,583 A | * | 1/1995 | Guckel et al. | 430/325 |
| 5,496,668 A | * | 3/1996 | Guckel et al. | 430/9 |
| 5,576,147 A | * | 11/1996 | Guckel et al. | 430/313 |
| 5,747,816 A | * | 5/1998 | Kurasaki | 250/491.1 |
| 5,755,947 A | * | 5/1998 | McElhanon et al. | 205/118 |
| 5,874,739 A | * | 2/1999 | Bushbeck et al. | 250/396 |
| 5,939,150 A | * | 8/1999 | Stelzle et al. | 427/558 |
| 6,018,422 A | * | 1/2000 | Feldman | 359/619 |

FOREIGN PATENT DOCUMENTS

| | | |
|---|---|---|
| EP | 075949 A2 | 4/1983 |
| EP | 158357 A2 | 10/1985 |
| JP | 58153326 A | 9/1983 |

OTHER PUBLICATIONS

Patent Abstracts of Japan, vol. 7, No. 272 (E–214), 1983 JP–58153326.

* cited by examiner

*Primary Examiner*—Kathleen Duda
(74) *Attorney, Agent, or Firm*—Birch, Stewart, Kolasch & Birch, LLP

(57) ABSTRACT

Structures of microminiature dimensions are formed by scanning a nearly parallel beam of high energy light ions across the surface of a resist material such as PMMA in a predetermined pattern. The resulting chemical changes in the exposed resist material allows a chemical developer to remove the exposed material while leaving the unexposed material substantially unaffected. In addition because the ions have a well defined range in the material depending on their energy, the resist can be exposed to a predetermined well defined depth. By this method, resist structures of three dimensional complexity can be micromachined. This is achieved by simultaneously scanning the beam and orienting the resist layer in a controlled manner. Further enhancement may be achieved by the use of multiple deposition and exposure of resist layers. These resist microstructures may be further utilized to produce microstructures in other materials by the application of processes such as electroplating and micromoulding.

35 Claims, 4 Drawing Sheets

1a

1b

2a

2b

2c

3a

3b

3c

4a

4b

4c

4d

MICROMACHINING USING HIGH ENERGY LIGHT IONS

This application is the national phase under 35 U.S.C. §371 of PCT International Application No. PCT/SG97/00057 which has an International filing date of Nov. 6, 1997 which designated the United States of America.

1. Field of the Invention

This invention relates to the area of manufacturing components and devices for micro-mechanical, micro-optical, micro-fluidic, micro-electronic, micro-acoustical, and micro-chemical applications. and utilises high energy light ions for micromachining. It can be applied either independently of, or in combination with, other techniques for micromachining.

2. Background of the Invention

The prior art which relates to the present invention is the use of X-rays for micromachining, commonly referred to by its German acronym LIGA(E. W. Becker, et.al., *Microelectronic Engineering* 4(1986)35–56; W. Ehrfeld and H. Lehr, *Radiat. Phys. Chem.* 45(1995)349–365), which in its most common embodiment comprises four main process steps:

i) In the first step a layer of positive polymer resist, usually polymethylmethacrylate (PMMA), which is typically several hundred microns thick and adhering to a metal substrate, is exposed in a deep X-ray lithography process using X-rays (usually from a synchrotron source) through a proximity X-ray mask. The use of a planar mask with defined areas of high and low transparency to X-rays is essential to this step.

ii) In the second step a suitable chemical developer is used to remove the exposed volume of the resist and expose selected areas of the underlying metal substrate. This chemical developer must be highly specific in completely removing the well exposed regions of resist while leaving unexposed or marginally exposed resist unaffected (V. Ghica and W. Glashauser, Verfahren fuer die spannungsfreie Entwicklung von bestrahlten Polymethylmethacrylat-Schichten, Offenlegungsschrift DE 3039110 Siemens AG, Munich).

iii) The third step is to electroplate metal onto the exposed metal substrate until the deposited metal thickness is equal to the resist thickness. The remaining resist is then removed to leave metal structures protruding from the metal substrate.

iv) In a fourth step these metal structures may be used as a mould to form structures in other materials.

The merits of the LIGA process lie chiefly in the ability of the first two process steps to form microstructures of large structural height (tens of microns to a few mm), with aspect-ratios up to 100. The aspect ratio is defined as the ratio of the structural height to the smallest lateral dimension. In typical practice, polymer structures with lateral dimensions of several microns to several hundred microns are formed by process steps one and two as described above. The limitations of the LIGA process which are relevant to the present invention are associated with the first process step of deep X-ray lithography using a proximity X-ray mask, and consist of the following:

a) That without undue complexity such a process is only suitable for the production of prismatic polymer structures on a planar base with walls perpendicular to the planar base.

b) That in applications where it is desirable that the deposition of energy by the exposure process should be of limited range or depth that the X-ray exposure process is unsuitable. This is due to the fact that X-rays are attenuated by matter, but do not have a fixed or well defined range.

c) That the cost and effort involved in fabricating a mask for the X-ray exposure step is high for the fabrication of prototype and low volume of production microstructures.

d) That the adhesion of the resist structures to the substrate can be adversely effected by the undesirable exposure of the resist due to photoelectrons, auger electrons, and fluorescence x-rays emitted from the substrate following absorption of x-rays from the primary source (F. J. Pantenburg, et.al., *Microelectronic Engineering* 23(1994) 223–226; F. J. Pantenburg and J. Mohr, *Nucl. Instrum. and Meth.* B97(1995)551–556)

OBJECTIVE OF THE INVENTION

It is a primary object of this invention to provide a means of exposing a resist, for the purpose of micromachining, by using a direct-write beam of energetic ions. Specifically, the type of ions employed in this invention are the isotopes of hydrogen, helium or lithium, with kinetic energies in excess of about 250 KeV.

Another object of this invention is to provide a means of creating microstructures in a resist many microns thick (eg greater than about 2 microns), which can either be of practical use in themselves, or to form microstructures in other materials, for example by electroplating onto a metal substrate.

It is a further object of the present invention that the microstructures created in a resist several microns thick (eg in the range 2 to 20 microns) can be of high-aspect-ratio (i.e. the height of the microstructures is large in comparison to their lateral dimensions).

It is another object of this invention to provide a means of exposing resist which overcomes many of the limitations associated with prior art, namely the deep X-ray lithography process which is the first step in the LIGA process.

Specific advantages of the present invention over prior art include, but are not limited to, a) the greater geometrical freedom in the microstructures which can be machined, b) reduction or elimination of damage to material underlying the resist, c) the ability to machine structures with sub-micron dimensions in resists of many microns thickness and d) the ability to micromachine structures without requiring a mask. Other objects, features and advantages of the present invention will become apparent from the detailed description which follows, or may be learned by practice of the invention.

BRIEF DESCRIPTION OF THE DRAWINGS

FIG. 2a: shows features formed by first exposure and development of resist 1.

FIG. 2b: shows a second exposure of the resist 1, scanning over the developed resist with the high energy light ions 2 to selectively expose areas 3.

FIG. 2c: shows the features following second development of resist 1.

FIG. 3a: shows the metallised substrate 4 & 5 with layer of resist 1 of uniform thickness which has already been selectively exposed 3.

FIG. 3b: shows the electroplated metal 6 formed in the structure after development and electroplating.

FIG. 3c: shows the metal microstructures 7 formed on the metallised substrate 4 & 5 after grinding or polishing and removal of the remaining resist. The metal microstructures 7 so formed may have a high aspect ratio as shown.

FIG. 4a: shows the exposed areas 3 of the resist 1.

FIG. 4b: shows above after deposition of another layer of resist 1.

FIG. 4c: shows a second exposure.

FIG. 4d: shows the features formed after the terminating development.

DESCRIPTION OF THE EMBODIMENTS OF THE INVENTION

Broadly according to this invention there is provided a method for exposing a defined area of a resist material to produce a change in a property of said area enabling said area to be selectively acted on, characterised in that the exposure is effected using a high energy beam of light ions.

Figure 1:
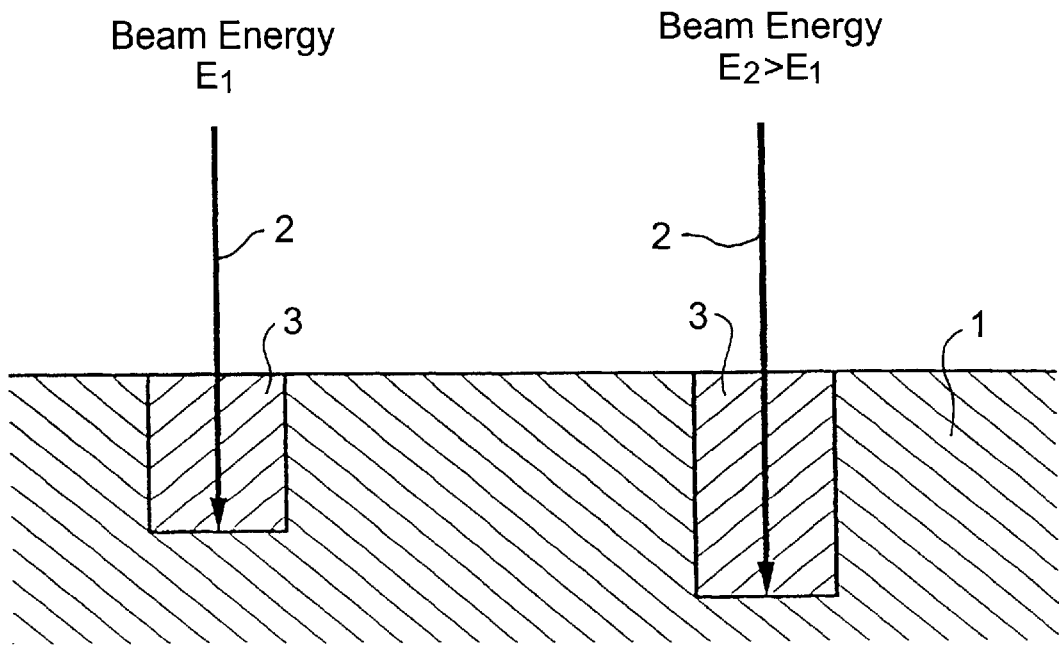
FIG. 1a shows the effect of exposing the resist 1 to high energy light ions 2 of different energy levels $E_1$ and $E_2$ ($E_1 > E_2$) followed by development of the exposed resist. The exposure is achieved using a beam of high energy light ions which are electrically or magnetically focused to produce a nearly parallel beam. Selective areas 3 of the resist 1 are exposed through the relative scanning motion between the beam and the resist 1.
FIG. 1b shows the resist 1 after development of the exposed resist.
Figure 1:
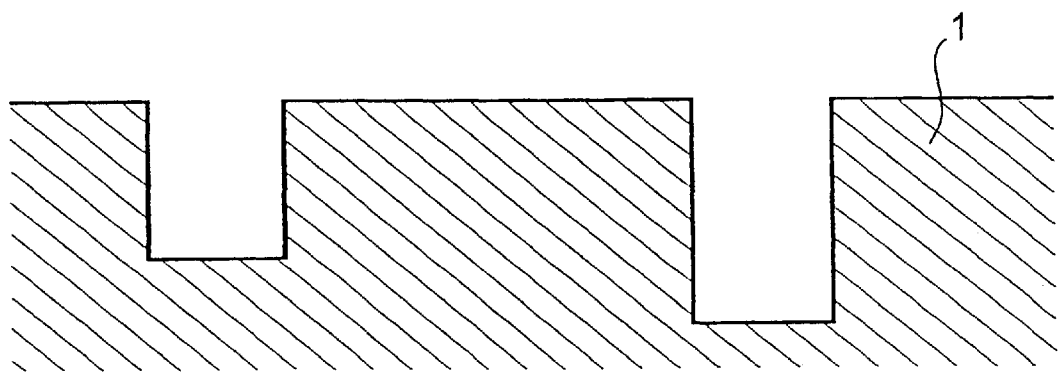

In the present invention, the exposure of the resist is achieved using a beam of high energy (e.g. between about 250 KeV to about 25 MeV) light ions (e.g. hydrogen, deuterium, tritium, helium mass three, helium mass four, lithium, beryllium., boron and carbon) (see FIG. 1a). In general the ions in the beam will be of a specific type and of a well defined energy, and the resist will be a suitable positive polymer resist such as PMMA. In many embodiments of the invention the ions will be electrically or magnetically focused to produce a nearly parallel beam, with a well defined range of diameters typically within the range of 100 nanometers to 10 micrometers.

In order to expose regions of the resist in a specified pattern (which can subsequently be developed chemically to produce resist microstructures) a means of scanning the beam over the resist surface is employed. Hence the present invention is a direct-write process, and no mask is required. This scanning system can be a magnetic or electrostatic beam deflection system whose operation is under computer control, or the computer controlled movement of the resist surface relative to the ion beam. The resist is developed using a highly specific chemical developer which completely removes the exposed regions of resist while leaving unexposed or marginally exposed resist substantially unaffected (V. Ghica and W. Glashauser) (see FIG. 1b). Moreover following a first exposure and development of the resist, there is no impediment to repeating the exposure and development of the same resist a multiplicity of times.

The present invention can be used to machine resist microstructures of a simple prismatic geometry as with prior art. For resists of several microns thickness the present invention enables microstructures with sub-micron lateral dimensions to be machined. Depending on the thickness of the resist the achievable aspect-ratio can be greater than that attainable by any other prior art process. This aspect of the present invention will be of considerable value in the fabrication of X-ray masks for deep X-ray lithography (as used in the LIGA process), as considerable difficulties are experienced using prior art techniques in fabricating masks of a sufficient thickness (F. J. Pantenburg, et.al; F. J. Pantenburg and J. Mohr).

One of the principal advantages of the present invention over prior art is that it also enables the machining of resist microstructures having a more complex three dimensional geometry. This can be achieved by several means as will described in greater detail below, but in each case this increased geometrical freedom arises from the action of two of the distinctive features of the present invention.

i) The first of these distinctive features is that the present invention is a direct-write process using a scanned beam. Hence not only can the beam be moved in a predetermined pattern over the surface of the resist, but it can also be orientated at any angle of incidence to the resist surface. This orientation of the beam is more conveniently achieved by angular movements of the resist material (along with any underlying material or object) rather than by changing the direction of the beam incident on a stationary resist.

ii) The second of the distinctive features of this invention is that energetic ions of a given type and of a single well defined kinetic energy have a finite and well defined mean range in the resist material. The ranges of individual ions exhibit only a comparatively small statistical variation about this mean range (typically a few percent). For example, for PMMA resist of density 1.2 g/cm3 protons with kinetic energy of 2.0 MeV have a mean range of about 62 microns, and 3.0 MeV protons a mean range of about 122 microns. For the purposes of the present invention this means that the exposure of the resist material ends at a range slightly beyond the mean range of the selected incident ions, and therefore blind holes, slots and other geometrical features can be formed in the resist material. It is of significance to the present invention that the range of the ions in the beam can be modified appropriately by a suitable choice of ion type and kinetic energy thereof, thereby determining the depth to which the resist is exposed (see FIG. 1a,1b). For light ions with kinetic energies in excess of about 250 KeV, the paths of the ions in the resist material are of sufficient range and the deviations from a straight line path are sufficiently low as to make them of use for the purposes of micromachining as in the present invention.

Figure 2:
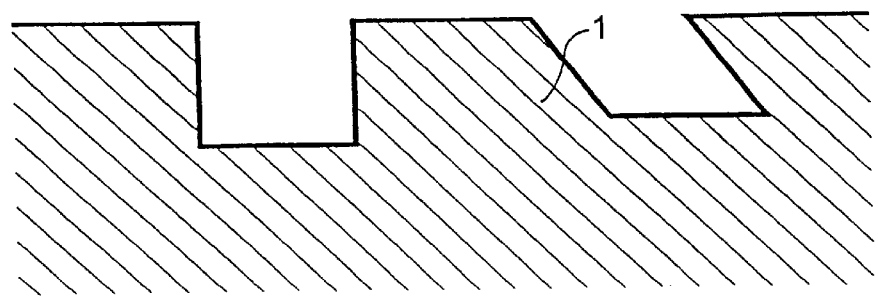
FIG. 2 shows structures in a resist 1 containing blind features and features formed by a sequence of exposure and development steps.
Figure 2:
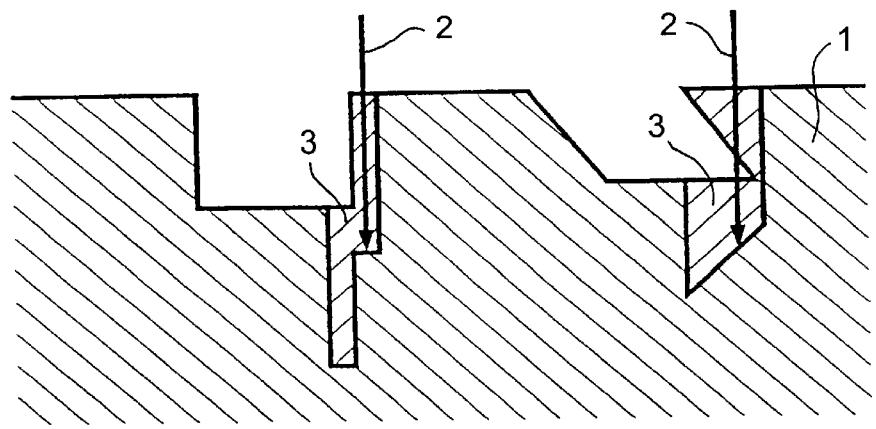
Figure 2:
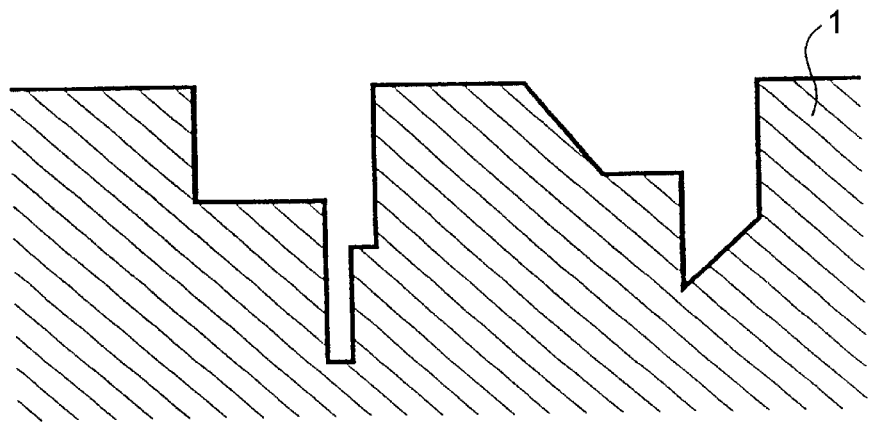

In some embodiments of the invention a sequence of exposure and development steps will be employed to create voids in the resist with a more complex three dimensional shape than can be created in a single exposure and development process. An embodiment of the invention which contains blind features and features formed by a sequence of exposure and development steps is illustrated in FIG. 2.

Figure 3:
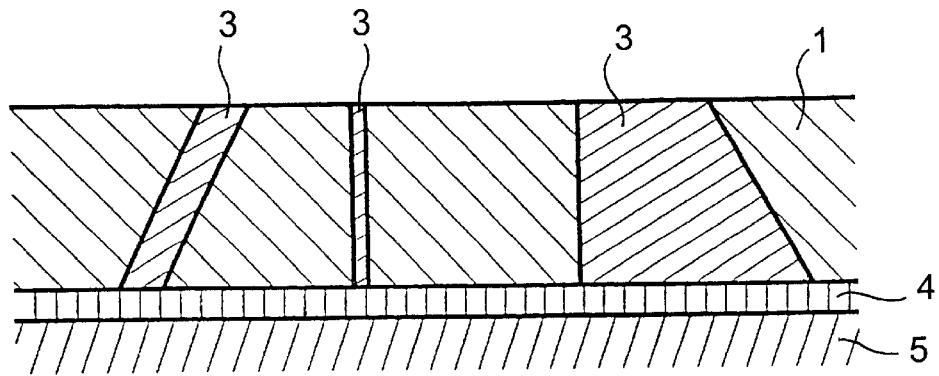
FIG. 3 shows the formation of metal microstructures of high aspect ratio onto a metal layer 4 over a substrate 5.
Figure 3:
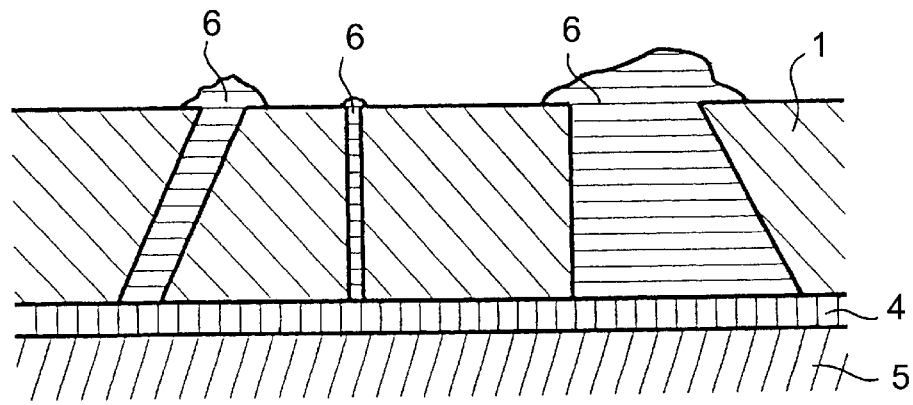
Figure 3:
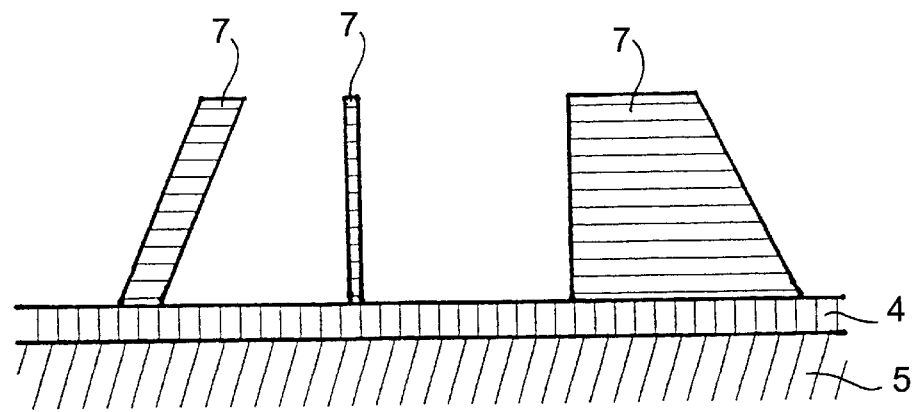

In some embodiments of the present invention. a metal surface will lie below the resist layer, and the invention will be put into effect by exposing certain areas of the resist layer to the full depth of the resist, i.e. the ions in the beam penetrate to the metal layer. Following development in a suitable chemical developer, metal is electroplated onto the exposed areas of the metal surface to the same depth as the resist layer. A grinding/polishing process may be used to remove metal deposited above the resist surface. The remaining resist is then removed to leave metal microstructures protruding from the metal substrate. In the present invention, metal microstructures can also be formed on a variety of non-metallic substrates, including silicon, germanium, other semiconducting materials, ceramic, glass and so forth, by first applying a metallic layer to the substrate (by for example sputtering) followed by a layer of resist to be structured. In general a planar substrate will be used and the resist layer will be of uniform thickness. Following structuring of the resist, metal structures would be formed in the manner described above. This process is illustrated in FIG. 3. For applications involving a metallic or metallised substrate, a particular advantage of the present invention over prior art is that the secondary radiations (secondary electrons, photoelectrons, auger electrons, and fluorescence x-rays) in the vicinity of the metal-resist interface is substantially lower than would be the case when X-rays are used as the primary means of exposure (ie. as for deep X-ray lithography, as used in LIGA), therefore greatly reducing problems associated with resist adhesion (F. J. Pantenburg, et.al; F. J. Pantenburg and J. Mohr). In some embodiments of the invention there may be no substrate material at all; the whole device or component to be machined being composed entirely of the resist material.

One particular embodiment of the invention would be the use of a semiconducting substrate on which electronic devices had previously been fabricated. Metal structures would then be formed on this substrate as described above, which would be in electrical contact with the underlying electronic devices. In this manner, the present invention could be used to fabricate sensor and actuator devices with integrated electronics. A particular advantage of the present invention for fabricating such integrated devices is that the range of the ions can be suitably chosen such that radiation damage or unwanted implantation of the underlying semiconducting material is avoided.

In some embodiments of the present invention the developed resist structures will have walls only perpendicular to the original resist surface. If the resist layer is of uniform thickness and adhering to a metal substrate this will permit the electroplating of metal structures with walls perpendicular to the metal substrate. While in other embodiments of the present invention the walls may be at various angles to the original resist surface, this having been achieved by arranging for the ion beam to be incident at various angles to the original resist surface, and at varying positions on the surface of the resist. In a further embodiment of the invention curved resist microstructure walls may be formed by coordinated movements and orientation of the ion beam. In embodiments of the present invention which employ a metal substrate this would enable metal structures with a complex three dimensional geometry to be created by electroplating.

Figure 4:
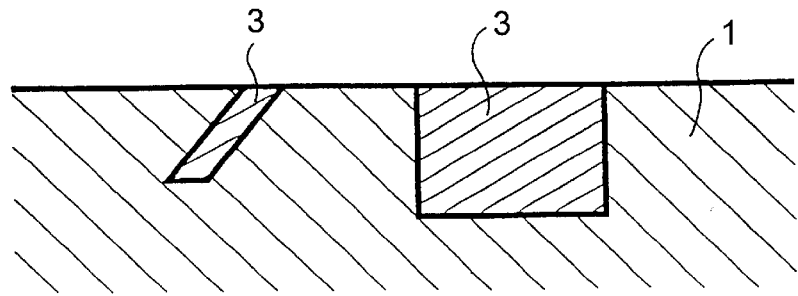
FIG. 4 illustrates the use of multiple steps of the basic process to produce structures of greater geometrical complexity.
Figure 4:
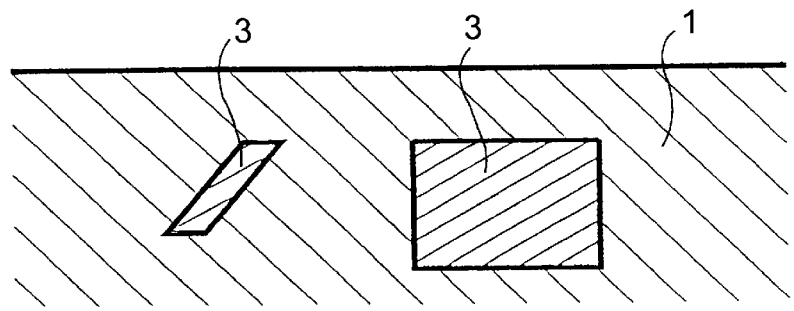
Figure 4:
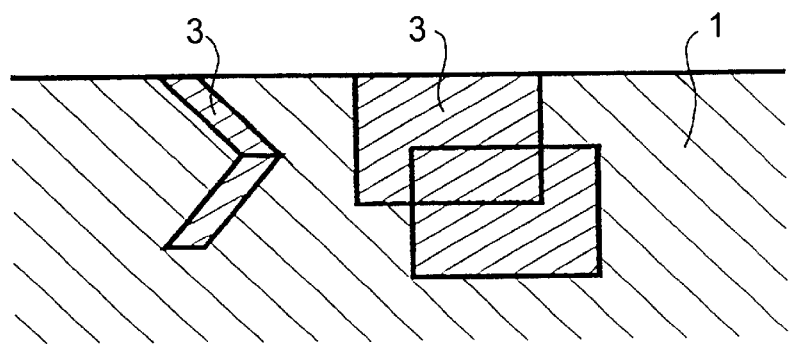
Figure 4:
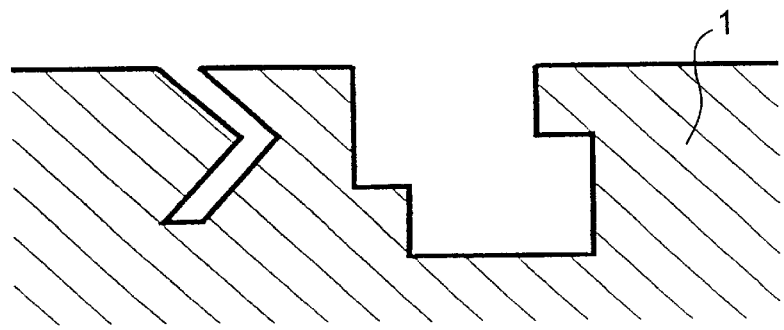

In other embodiments of the present invention resist structures of greater geometrical complexity can be made with the use of a multi-step processes, in which a succession of resist layer deposition and exposure steps are terminated with a single development of all exposed volumes of resist. Such a multi-step process could comprise: repeated exposure steps (without intervening development); additions of further resist layers to the existing resist surface; variation of the scanned pattern and orientation of the ion beam for each resist layer; and variation of the energy or type of ions employed for the exposure step in order to select depth of penetration. At the end of such a multi-step process a final development step would be used to remove all exposed volumes of the resist which are accessible to the chemical developer. FIG. 4 illustrates such an embodiment of the present invention. In embodiments of the invention which employ a metallic or metallised substrate, the application of the above described multi-step process would enable metal structures of almost arbitrary geometrical complexity to be electroplated onto the surface of the substrate.

In all embodiments of the present invention in which metal structures are formed by means of electroplating, these metal microstructure could be further utilised to produce microstructures in other materials by micromoulding, as is sometimes done in prior art techniques. Other embodiments of the present invention could use one or more sacrificial layers in combination with electroplating to produce metal structures which are partially or wholly detached from the underlying metal substrate.

In all embodiments of the present invention described above it is assumed that a positive resist material would be employed (such as PMMA) for which the exposed regions of the resist material are removed by a chemical developer. But the present invention could equally be put into effect with the use of a suitable negative resist material (and developer) for which the unexposed regions of the developer are removed by the chemical developer and the exposed regions remain substantially intact.

In many of the above described embodiments, the invention is performed using a resist layer of uniform thickness, which adheres to an underlying planar substrate of some other material, but the practice of the invention does not preclude the use of objects which have a more complicated three dimensional shape, whither these objects be composed solely of resist material or comprise both resist and materials of other types. In particular some embodiments of the invention ion beam micromachining could be performed on a resist material which had already been structured using some other method of micromachining, for example deep X-ray lithography. Such an embodiment of the invention would exploit the advantageous features of the prior micromachining process, for example the large structural height which can be achieved using LIGA, and extend its range of application by exploiting the strengths of the present invention, namely the greater geometrical freedom and finite range of exposure.

Generally all embodiments of the invention will employ a magnetic or electrostatic beam deflection system under computer control, to scan the ion beam over the resist material such as to write (expose) a predetermined pattern in the resist. Generally the facility to blank the beam (i.e. rapidly switch the beam intensity to zero) is required, and must also be computer controlled, so that separated enclosed regions of exposure can be written. In some embodiments of the invention the exposure may be made with a single scan of the predetermined pattern, while in other embodiments of the invention the scan pattern may be re-written a multiplicity of times in precisely the same region of resist. Re-writing the pattern a multiplicity of times has the advantage of averaging out variations in beam intensity which otherwise would result in poor uniformity in the desired exposure. Generally the area-of-coverage of a magnetic or electrostatic beam deflection system is quite limited. By area-of-coverage it is meant the actual surface area of resist at normal incidence to the beam, over which the ion beam can be scanned without significantly degrading the fine focusing of the beam. The area-of-coverage may in a some embodiments of the invention be a square with a side of approximately 1 mm. In some embodiments of the invention a greater coverage than can be conveniently attained with a beam deflection system may be required. These embodiments of the invention will employ not only a beam deflection system as a primary means of scanning a pattern, but additionally a two or three axis translation stage to move the object to which the resist is attached. The movements of the stage will be computer controlled and coordinated with the operation of the beam deflection and blanking system. In embodiments of the invention in which microstructure walls at varying angles to the resist surface are to be machined the translational motions of a three axis stage are combined with a mechanism for orientating the object to which the resist is attached with three angular degrees of motion. The actions of this six axis system will be computer controlled and coordinated with the operation of the beam deflection and blanking system.

What is claimed is:

1. A method for preparing a component comprising exposing a defined area of a maskless resist material to produce a chemical change in a property of said area enabling said area to be selectively removed or rendered inert wherein the defined area is exposed with a high energy beam of light ions, the beam having an energy greater than 250 KeV.

2. A method in accordance with claim 1 wherein said change is acted on by a chemical developer.

3. A method in accordance with claim 2, wherein said chemical developer selectively removes the exposed resist material.

4. A method in accordance with claim 1, wherein the said exposure produces a change in a property of said defined area exposed to the high energy beam of light ions rendering said defined area inert, and wherein an area not exposed to the high energy ions is selectively acted on.

5. A method in accordance with claim 1, wherein the resist material comprises a positive polymer resist.

6. A method in accordance with claim 5, wherein the positive resist is polymethylmethacrylate (PMMA).

7. A method in accordance with claim 1, wherein the ions are electrically or magnetically focused to produce a parallel beam, which is scanned over the surface of the resist material in a predefined pattern thereby producing three dimensional microstructures in the developed material resist.

8. A method in accordance with claim 7, wherein the microstructures produced in the developed resist are used for the purposes of fabricating a mask for X-ray lithography as used in a LIGA or other lithographic process.

9. A method in accordance with claim 8, wherein the parallel beam has a diameter within the range of about 100 nanometers to 10 micrometers.

10. A method in accordance with claim 7, wherein the beam is at an angle to the resist surface which is changed in a controlled fashion during the scanning of the beam.

11. A method in accordance with claim 10, wherein the parallel beam has a diameter within the range of about 100 nanometers to 10 micrometers.

12. A method in accordance with claim 7, wherein microstructures are produced in the exposed resist, having a depth which is determined by the selection of ion type, energy and angle of incidence on the resist surface.

13. A method in accordance with claim 12, wherein the microstructures are holes, slots or voids of other geometries.

14. A method in accordance with claim 12, wherein the parallel beam has a diameter within the range of about 100 nanometers to 10 micrometers.

15. A method in accordance with claim 1, wherein the direction of the beam is modified to produce prismatic structures in the developed resist.

16. A method in accordance with claim 1, wherein the exposure comprises a multiplicity of exposure steps with ions of a different energy or a different type.

17. A method in accordance with claim 1, wherein a sequence of alternating exposure and development steps are applied a multiplicity of times to the same resist material, to create resist voids with a three dimensional geometry.

18. A method in accordance with claim 1, wherein the exposed resist is not developed immediately and wherein an additional layer of resist is made to adhere to the original resist surface following which a further exposure is made after which all regions of the exposed resist which are accessible to the developer are developed.

19. A method in accordance with claim 1, wherein a multiplicity of resist layer additions and associated exposures are performed, following which all regions of the exposed resist which are accessible to the chemical developer are developed.

20. A method in accordance with claim 1, wherein a metallic or metallised substrate material underlies the resist layer or layers, and following development, the voids within the resist are filled, either partially or wholly, by electroplating metal onto the exposed areas of the underlying metal substrate to produce metal microstructures.

21. A method in accordance with claim 20, wherein the metallised substrate comprises a semiconducting material, in which electronic devices have been fabricated to produce micromechanical devices with integrated electronics.

22. A method in accordance with claim 20, wherein the produced metal microstructures are used to create microstructures in other materials by the process of micromoulding.

23. A method in accordance with claim 1, wherein one or more sacrificial layers are employed such that, after removal of the sacrificial layer or layers, metal microstructures are formed which are either partially or wholly detached from an underlying metal substrate.

24. A method in accordance with claim 1, modified by the use of a nagative resist material which is exposed, thereby rendering the exposed the resist material inert to a chemical developer which is highly specific in the removal of the unexposed material while leaving the exposed material substantially unaffected.

25. A method in accordance with claim 1 wherein the resist has been structured by a prior micromachining process.

26. A method in accordance with claim 1 wherein an exposure pattern is defined lithographically using a proximity mask with open areas through which the incident ions in the beam pass unaffected thereby exposing the underlying resist, and other areas composed of material of sufficient thickness and density to completely absorb the incident ions thereby leaving the resist underlying such regions unexposed.

27. A method in accordance with claim 26, modified by using a patterned proximity mask which has some areas composed of material of sufficient thickness to allow transmission of the ions but at reduced energy.

28. A method in accordance with claim 27, using a beam of light ions having an energy greater than 250 KeV to expose a resist material as a step in micromachining structures.

29. A method in accordance with claim 1, wherein an exposure pattern is defined by a lithographic process employing projection, by means of an image forming system, of the image of a mask which selectively absorbs or scatters ions, onto the surface of the resist.

30. A method in accordance with claim 1, wherein the component is micromechanical, micro-optical, microfluidic, micro-electric, micro-acoustical or micro-chemical.

31. A micromechanical component produced by the method of claim 1.

32. A method for preparing a component comprising exposing a defined area of a maskless resist material to produce a chemical change in a property of said area enabling said area to be selectively removed or rendered inert wherein the defined area is exposed with a high energy beam of light ions, the beam having an energy greater than 250 KeV, wherein the light ions comprise isotopes of hydrogen, helium or lithium.

33. A method in accordance with claim 32, wherein the beam of light ions is parallel with a diameter within the range of about 100 nanometers to 10 micrometers.

34. A method for preparing a component comprising exposing a defined area of a maskless resist material to produce a chemical change in a property of said area enabling said area to be selectively removed or rendered inert wherein the defined area is exposed with a high energy beam of light ions, the beam having an energy greater than 250 KeV, wherein the ions are electrically or magnetically focused to produce a parallel beam, which is scanned over the surface of the maskless resist material in a predefined pattern thereby producing three dimensional microstructures in the developed material resist, wherein the microstructures produced in the developed resist material have a high aspect-ratio.

35. A method in accordance with claim 34, wherein the parallel beam has a diameter within the range of about 100 nanometers to 10 micrometers.

* * * * *